United States Patent
Liang et al.

(10) Patent No.: US 10,069,274 B2
(45) Date of Patent: Sep. 4, 2018

(54) TUNABLE OPTICAL DEVICE

(71) Applicant: HEWLETT PACKARD ENTERPRISE DEVELOPMENT LP, Houston, TX (US)

(72) Inventors: Di Liang, Santa Barbara, CA (US); Geza Kurczveil, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/316,157

(22) PCT Filed: Jul. 25, 2014

(86) PCT No.: PCT/US2014/048225
§ 371 (c)(1),
(2) Date: Dec. 2, 2016

(87) PCT Pub. No.: WO2016/014078
PCT Pub. Date: Jan. 28, 2016

(65) Prior Publication Data
US 2017/0133824 A1    May 11, 2017

(51) Int. Cl.
*G02B 6/00* (2006.01)
*H01S 5/06* (2006.01)
*H01S 5/22* (2006.01)

(52) U.S. Cl.
CPC .............. *H01S 5/0607* (2013.01); *H01S 5/22* (2013.01)

(58) Field of Classification Search
CPC ............ G02B 6/00; H01S 5/06; H01S 5/0607
USPC .............................................................. 385/1
See application file for complete search history.

(56) References Cited

U.S. PATENT DOCUMENTS

| | | | | |
|---|---|---|---|---|
| 4,917,451 | A * | 4/1990 | Chouinard | G02B 6/30 385/132 |
| 5,671,242 | A * | 9/1997 | Takiguchi | B82Y 20/00 257/18 |
| 2001/0028503 | A1 | 10/2001 | Flanders et al. | |
| 2002/0054416 | A1 | 5/2002 | Huang et al. | |
| 2003/0012231 | A1 | 1/2003 | Tayebati et al. | |
| 2003/0058902 | A1 | 3/2003 | Yuen | |
| 2003/0169786 | A1 * | 9/2003 | Kapon | B82Y 20/00 372/20 |

(Continued)

FOREIGN PATENT DOCUMENTS

WO   WO-2012149497 A2   11/2012
WO   WO-2013110004 A1    7/2013

OTHER PUBLICATIONS

PCT/ISA/KR, International Search Report, dated Apr. 15, 2015, PCT/US2014/048225, 13 pages.

*Primary Examiner* — Kaveh C Kianni
(74) *Attorney, Agent, or Firm* — Tarolli Sundheim, Covell & Tummino L.L.P.

(57) ABSTRACT

One example includes an optical device system. The system includes a waveguide that includes a fixed waveguide portion to propagate an optical signal, a semiconductor membrane layer, and a tunable air gap that separates the fixed waveguide portion and the semiconductor membrane layer. The system also includes an optical tuning system to move the semiconductor membrane layer with respect to the fixed waveguide portion in response to a control signal to control a separation distance of the tunable air gap to tune a characteristic of the optical signal.

10 Claims, 4 Drawing Sheets

(56) References Cited

U.S. PATENT DOCUMENTS

| | | | |
|---|---|---|---|
| 2008/0193133 A1* | 8/2008 | Krug | G02B 6/12007 398/83 |
| 2012/0008658 A1 | 1/2012 | Chung | |
| 2013/0152694 A1* | 6/2013 | Urvas | G01L 9/0048 73/724 |
| 2014/0050242 A1* | 2/2014 | Taylor | H01L 29/0688 372/45.012 |

* cited by examiner

TUNABLE OPTICAL DEVICE

BACKGROUND

Optical communications have become more prevalent as the demand for high-speed communication and processing has increased. Optical communications typically implement a laser and/or other optical devices for providing and receiving optical signals. In optical devices, wavelength (e.g., phase) and power tuning is often implemented. For example, in optical systems that implement a large number of optical devices in the same system, tuning is typically required based on material and fabrication process variations across the multiple devices. As an example, optical devices are typically tuned based on varying an amplitude of injection current, resulting in a change in output power and wavelength of the optical device. As another example, optical devices can be tuned based on varying a refractive index of one or more layers based on carrier injection and/or thermal changes, resulting in increased power consumption and/or a larger device footprint.

DETAILED DESCRIPTION

Figure 1:
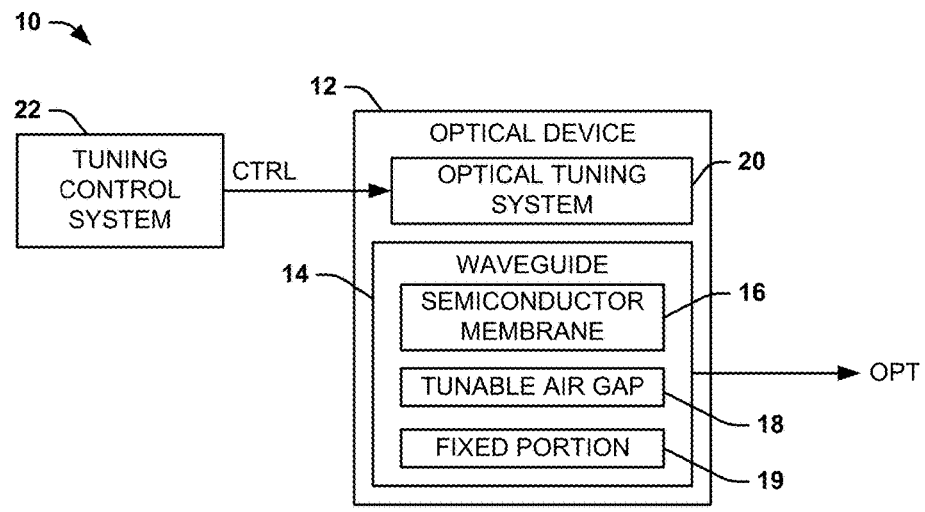
FIG. 1 illustrates an example of an optical system.

FIG. 1 illustrates an example of an optical system 10. As an example, the optical system 10 can be implemented in an optical communication system. The optical system 10 includes an optical device 12, which can be configured, for example, as a laser (e.g., a hybrid laser). Alternatively, the optical device 12 can be configured as any of a variety of other types of optical devices, such as a photodetector, a hybrid amplifier, and/or a modulator.

The optical device 12 includes a waveguide 14 that is configured to propagate an optical signal OPT. As described herein, the term "waveguide" refers to a region of the optical device 12 in which the optical signal propagates or is provided, and is not limited to a semiconductor portion of the optical device 12. In the example of FIG. 1, the optical signal OPT is demonstrated as being emitted from the waveguide 14, such as in the example of the optical device 12 being configured as a laser in which the optical signal OPT is generated by the optical device 12 (e.g., via an active layer, such as a multiple quantum well (MQW)). However, the optical signal OPT can instead be provided into the waveguide 14, such as from an external optical source. The waveguide 14 can be formed in a semiconductor (e.g., silicon) layer, such that the waveguide 14 can have a defined width based on etching of the semiconductor layer during fabrication of the optical device 12.

The waveguide 14 includes a semiconductor membrane layer 16, a tunable air gap 18, and a fixed waveguide portion 19 in which the optical signal OPT can propagate. As an example, the semiconductor membrane layer 16 can correspond to a layer of semiconductor material that is thin relatively to other material layers in the optical device 12. For example, the semiconductor membrane layer 16 can be configured as a doped Group III-V material layer (e.g., N—InP). The semiconductor membrane layer 16 can be separated from the fixed waveguide portion 19 by the tunable air gap 18. The semiconductor membrane layer 16 can be substantially elastic, such that a separation distance of the tunable air gap 18, and thus the distance between the fixed waveguide portion 19 and the semiconductor membrane layer 16, can vary. As described herein, the separation distance of the tunable air gap 18 can dictate an optical confinement of the optical signal OPT in the waveguide 14, and thus can tune a characteristic of the optical signal OPT.

The optical device 12 also includes an optical tuning system 20. The optical tuning system 20 can include, for example, a doped semiconductor layer (e.g., a heavily-doped silicon layer) and at least one electrode. The optical tuning system 20 can be coupled to the semiconductor membrane layer 16. For example, the doped semiconductor layer of the optical tuning system 20 can be coupled to the semiconductor membrane layer 16 at a first location and a second location that are each separate from and spaced apart from the fixed waveguide portion 19 by a distance that is approximately equal with respect to each of the first and second locations. As a result, any defects at a heterogeneous interface that may result from fabrication of the optical device 12 (e.g., via heteroepitaxial or wafer bonding approaches), such as via lattice mismatch and/or thermal expansion, can be separated from an associated active region of the optical device 12. Accordingly, deleterious electrical effects resulting from the defects with respect to operation of the optical device 12 can be substantially mitigated.

In the example of FIG. 1, the system 10 also includes a tuning control system 22 configured to generate a control signal CTRL that is provided to the optical tuning system 20. As an example, the control signal CTRL can be provided to the electrode(s) of the optical tuning system 20 as a voltage signal having a magnitude and/or polarity relative to a carrier injection electrode (e.g., an N or P carrier injection electrode that affects an MOW of the optical device 12). Because the optical tuning system 20 is coupled to the semiconductor membrane layer 16, the control signal CTRL can be implemented to move the semiconductor membrane layer with respect to the fixed waveguide portion 19 to control the separation distance of the tunable air gap 18.

Accordingly, the movement of the semiconductor membrane layer 16 with respect to the fixed waveguide portion 19 can tune a characteristic of the optical signal OPT based on the separation distance of the tunable air gap 18. As an example, the characteristic of the optical signal OPT that can be tuned can be output power, phase, and/or wavelength of the optical signal OPT. For example, the separation distance of the tunable air gap 18 can affect the confinement of the optical modes of the optical signal OPT, which can thus implement tuning of the optical signal OPT. As an example, the separation distance of the tunable air gap 18 can be controlled between a substantially maximum physical separation distance and thus a substantially minimum modal index to result in a substantially minimum wavelength of the optical signal OPT, and a substantially minimum physical separation distance (e.g., approximately zero), and thus a substantially maximum modal index to result in a substantially maximum wavelength of the optical signal OPT.

Additionally, because the control signal CTRL can be implemented as a voltage signal with little or zero current flow between the electrode(s), the tuning of the characteristic of the optical signal OPT can be performed at very little (e.g., approximately zero) power. As described previously, the control signal CTRL can be provided to the electrode(s) of the optical tuning system 20 as a voltage signal having a magnitude and/or polarity relative to a carrier injection electrode. Therefore, the magnitude and/or polarity of the voltage of the control signal CTRL can dictate the distance and direction of the movement of the semiconductor membrane layer 18 to tune the optical signal OPT.

It is to be understood that the tuning capabilities of the optical device 12 can provide other benefits depending on the functionality of the optical device 12. As an example, the optical device 12 can be configured to receive the optical signal OPT that can propagate in the waveguide, such that adjustment of the separation distance of the tunable air gap 18 can affect other parameters associated with the optical signal OPT. For example, for the optical device 12 being configured as an amplifier or photodetector system, a tuning confinement factor in respective Group III-V or silicon material layers can allow slower or faster amplification or absorption, depending on the photonic application. As another example, electro-absorption devices or phase modulators can benefit from tunablity in extinction ratio based on the movement of the tunable air gap 18 as described herein.

As an example, the optical device 12 can be configured as a mode-locked laser, as opposed to a continuous-wave (CW) signal. For example, the optical system 10 can include an amplifier that is cascaded with an absorber to form optical pulses via the optical device 12. The mode-locking regime of the optical device can depend on biases of the amplifier/absorber, quantum well confinement, lengths of the individual sections, and a location of the absorber relative to the amplifier. Therefore, the optical device 12 can be configured to control the separation distance of the tunable air gap 18 to further tune mode-locking, and can thus extend a regime over which the optical device 12 can obtain mode-locking of the optical signal OPT. Thus, the optical device 12 configured as a mode-locked laser can provide better mode-locking control, as opposed to a typical mode-locked laser that can be tuned solely by adjusting the bias of the amplifier/absorber sections, which can limit the operational regime of the typical mode-locked laser.

As another example, the optical device 12 can correspond to a saturable absorber (SA) in a 2R regenerator system that also includes a semiconductor optical amplifier (SOA). The optical device 12 configured as an SA can thus provide a substantially non-linear transfer function for optical signal power of the received optical signal OPT, such that an intensity of the optical signal OPT that is less than a given threshold can be substantially completely absorbed, and thus experiencing significant optical losses, resulting in a very low gain of the SOA. Conversely, an intensity of the optical signal OPT that is greater than the given absorption threshold of the SA can be substantially completely transmissive through the SA (i.e., treating the SA active material layer as substantially transparent), and thus resulting in a high gain of the SOA. Because the saturation of the optical signal OPT depends on the optical power of the optical signal OPT, such that low input power of the optical signal OPT is subject to greater optical losses, the optical device 12 configured as an SA can be configured as a filter to substantially mitigate low-level optical noise (e.g., in a logic-low level of the optical signal OPT).

For example, the optical device 12 can operate as an SA based on a reverse-bias potential applied to an associated active region layer (e.g., for an active region 10-100 μm in length), or based on implanting an Ni+ dopant or an H+ dopant into a quantum well active region layer to provide saturable absorption of the optical signal OPT propagating in the waveguide 14. In this example, the absorption of the optical signal OPT by the optical device 12 can be based on a combined length of the SA and SOA, as well as an optical confinement of the optical signal OPT in the waveguide 14. Accordingly, the separation distance of the tunable air gap 18 based on the movement of the semiconductor membrane 16 can control the optical confinement of the optical signal OPT, as described herein, and can thus adjust the absorption of the optical signal OPT in the optical device 12. As a result, the optical device 12 can adjust the absorption threshold of the optical signal OPT in a manner that is independent of the optical power of the optical signal OPT, resulting in tuning of the optical power-based decision level of the associated 2R regenerator system. Accordingly, the optical device 12 can be implemented to tune optical confinement in a variety of optical receiver devices, as well as optical transmission devices.

Figure 2:
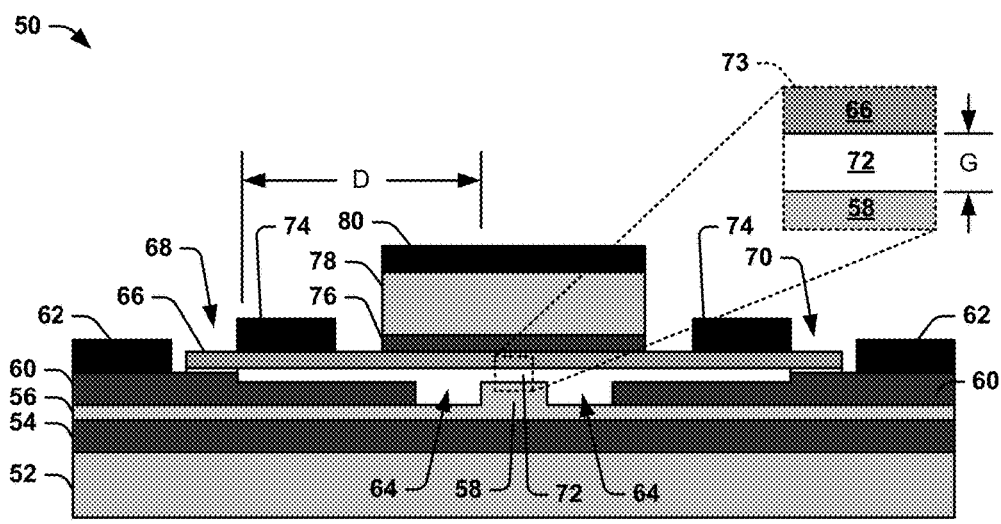
FIG. 2 illustrates an example of a tunable optical device.

FIG. 2 illustrates an example of a tunable optical device 50. The tunable optical device 50 can correspond to the optical device 12 in the example of FIG. 1. For example, the tunable optical device 50 can be configured as a laser (e.g., a hybrid laser), or as any of a variety of other types of optical devices, such as a photodetector, a hybrid amplifier, and/or a modulator. The tunable optical device 50 is demonstrated in the example of FIG. 2 in a cross-sectional view demonstrating the fabrication material layers.

The tunable optical device 50 includes a substrate layer 52, an insulator (e.g., oxide) layer 54, and a semiconductor layer 56. As an example, the substrate layer 52 and the semiconductor layer 56 can be fabricated as silicon, such that the substrate layer 52, the insulator layer 54, and the semiconductor layer 56 can be fabricated from a silicon-on-insulator (SOI) structure. In the example of FIG. 2, the semiconductor layer 56 includes an etched portion 58 corresponding to a fixed waveguide portion (hereinafter "fixed waveguide portion 58") configured to propagate the optical signal OPT.

In addition, the tunable optical device 50 includes a control layer 60 that is approximately level with the fixed waveguide portion 58, and a pair of electrodes 62 that overly the control layer 60. As an example, the control layer 60 can be fabricated as a heavily doped semiconductor layer (e.g., P++ or N++ silicon layer), or can be fabricated as a metal or electrically conductive polymer layer. Collectively, the control layer 60 and the electrodes 62 can correspond to the optical tuning system 20 in the example of FIG. 1, as described in greater detail herein. The heavily-doped layer 60 extends toward the fixed waveguide portion 58 and is separated from the fixed waveguide portion 58 by a trench 64 on either side of the fixed waveguide portion 58. The tunable optical device 50 also includes a semiconductor membrane layer 66 (e.g., corresponding to the semiconductor membrane layer 16 in the example of FIG. 1). The semiconductor membrane layer 66 is demonstrated in the example of FIG. 2 as coupled to the control layer 60 (e.g., via a dielectric insulator). The coupling of the semiconductor membrane layer 66 to the control layer 60 is demonstrated as being at a first location 68 and at a second location 70 that are each separate from and spaced apart from the fixed waveguide portion 58 by a distance "D" that is approximately equal with respect to each of the first and second locations 68 and 70.

As an example, the semiconductor membrane layer 66 can be fabricated as a Group III-V material layer (e.g., N—InP) that is relatively thinner than the other layers of the tunable optical device 50. In the example of FIG. 2, the semiconductor membrane layer 68 is demonstrated as being offset from the fixed waveguide portion 58 via a tunable air gap 72. The fixed waveguide portion 58, the semiconductor membrane layer 66, and the tunable air gap 72 can thus collectively constitute a waveguide of the tunable optical device 50, in which confinement of the optical signal OPT can be controlled, as described herein. As an example, the tunable air gap 72 can result from an offset based on an elevated portion of the control layer 60 and/or the dielectric insulator at the first and second locations 68 and 70 at which the semiconductor membrane layer 66 is coupled to the control layer 60. In the example of FIG. 2, the tunable air gap 72 is separated from the fixed waveguide portion 58 by a separation distance "G", as demonstrated in the exploded view 73, which can be adjustable as described herein.

The tunable optical device 50 also includes carrier-injection electrodes 74 that are arranged on top of the semiconductor membrane layer 66 and oppositely spaced apart with respect to the fixed waveguide portion 58. The tunable optical device 50 further includes an active layer 76, a semiconductor material layer 78 overlying the active layer 76, and a carrier-injection layer 80. As an example, the carrier-injection electrodes 74 can correspond to N-type carrier doped while the carrier-injection layer 80 can correspond to P-type carrier doped. For example, the active layer 76 can be a single or multiple quantum well layer, a quantum dot layer, or a Group III-V material layer. The active layer 76 can thus correspond to an active region, such as to generate photons in the example of the tunable optical device 50 corresponding to a hybrid-laser. The semiconductor material layer 78 can correspond, for example, to a Group III-V layer (e.g., P—InP). Thus, the semiconductor material layer 78 can cooperate with the fixed waveguide portion 58 to provide modal confinement of the optical signal OPT in the waveguide formed by the fixed waveguide portion 58, the semiconductor membrane layer 66, and the tunable air gap 72. In addition, as described previously, the semiconductor membrane layer 66 is coupled to the control layer 60 at the first and second locations 68 and 70 separated from and spaced apart from the fixed waveguide portion 58 by an approximately equal distance "D". Therefore, defects that can form at a heterogeneous interface during fabrication of the tunable optical device 50, such as via lattice mismatch and/or thermal expansion, can be eliminated from the active region to substantially mitigate deleterious effects of the defects with respect to electrical operation of the tunable optical device 100.

In response to a control signal (e.g., the control signal CTRL) being provided to the electrodes 62, an electric field can be provided in the tunable air gap 72 between the control layer 60 and the semiconductor membrane layer 66 based on an amplitude of the control signal CTRL and a polarity of the control signal CTRL relative to the polarity of the carrier-injection electrodes 74. The electric field can thus provide an attractive or repulsive force based on the amplitude of the control signal CTRL and a polarity of the control signal CTRL relative to the polarity of the carrier-injection electrodes 74. As a result, the control signal CTRL can be implemented to move the semiconductor membrane layer to increase or decrease the separation distance "G" of the of the tunable air gap 72 with respect to the fixed waveguide portion 58.

Accordingly, the movement of the semiconductor membrane layer 66 with respect to the fixed waveguide portion 58 can tune a characteristic of the optical signal OPT based on the separation distance "G" of the tunable air gap 72. As an example, the characteristic of the optical signal OPT that can be tuned can be output power, phase, and/or wavelength of the optical signal OPT. For example, the separation distance of the tunable air gap 72 can affect the confinement of the optical modes of the optical signal OPT, which can thus implement tuning of the optical signal OPT. As an example, the separation distance of the tunable air gap 72 can be controlled between a substantially maximum physical separation distance, and thus a substantially minimum modal index to result in a substantially minimum wavelength of the optical signal OPT, and a substantially minimum physical separation distance (e.g., approximately zero), and thus a substantially maximum modal index to result in a substantially maximum wavelength of the optical signal OPT.

Figure 3:
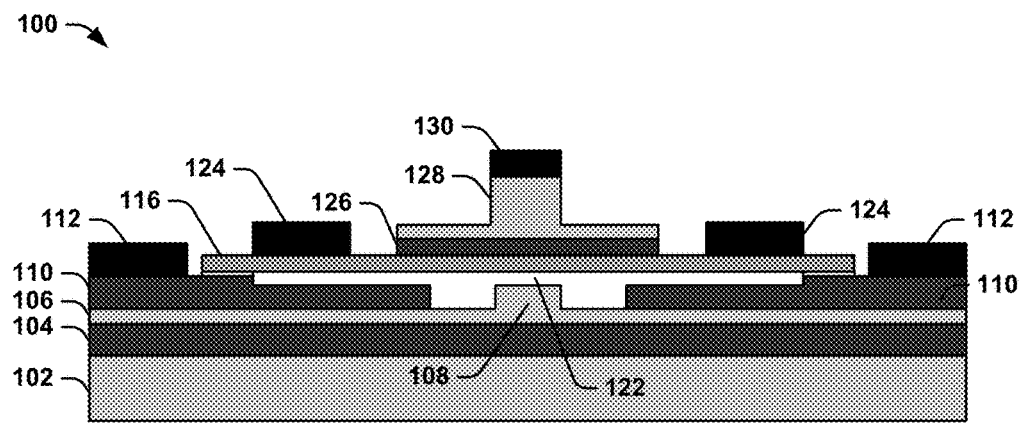
FIG. 3 illustrates another example of a tunable optical device.

FIG. 3 illustrates another example of a tunable optical device 100. The tunable optical device 100 can correspond to the optical device 12 in the example of FIG. 1. For example, the tunable optical device 50 can be configured as a laser (e.g., a hybrid laser), or as any of a variety of other types of optical devices, such as a photodetector, a hybrid amplifier, and/or a modulator. The tunable optical device 100 is demonstrated in the example of FIG. 3 in a cross-sectional view demonstrating the fabrication material layers.

The tunable optical device 100 is configured substantially similar to the tunable optical device 50 in the example of FIG. 2. In the example of FIG. 3, the tunable optical device 100 includes a substrate layer 102, an insulator (e.g., oxide) layer 104, and a semiconductor layer 106, such as can be fabricated from a silicon-on-insulator (SOI) structure, with the semiconductor layer 106 including an etched portion 108 corresponding to a fixed waveguide portion (hereinafter "fixed waveguide portion 108") configured to propagate the optical signal OPT. In addition, the tunable optical device 100 includes a control layer 160 (e.g., a P++ silicon layer) and a pair of electrodes 162 that overly the control layer 160 to form an optical tuning system (e.g., the optical tuning system 20). The tunable optical device 100 also includes a semiconductor membrane layer 166 coupled to the control layer 160 (e.g., via a dielectric insulator) at a first location 168 and at a second location 120 that are each separate from and spaced apart from the fixed waveguide portion 108 to form a tunable air gap 172, similar to as described previously.

The tunable optical device 100 also includes carrier-injection electrodes 124 that are arranged on top of the semiconductor membrane layer 166 and oppositely spaced apart with respect to the fixed waveguide portion 108. The tunable optical device 100 further includes an active layer 126, a semiconductor material layer 128 overlying the active layer 126, and a carrier-injection layer 130. As an example, the carrier-injection electrodes 124 can correspond to N-type carrier doped while the carrier-injection layer 130 can correspond to P-type carrier doped. The active layer 126 can thus correspond to an active region, such as to generate photons in the example of the tunable optical device 100 corresponding to a hybrid-laser. The semiconductor material layer 128 can correspond, for example, to a Group III-V layer (e.g., P—InP).

In the example of FIG. 3, the semiconductor material layer 128 is demonstrated as stepped, such that the portion of the semiconductor material layer 128 that is not in contact with the active layer 126 has a width that is substantially less than the width of the portion of the semiconductor material layer 128 that is in contact with the active layer 126. For example, the portion of the semiconductor material layer 128 that is not in contact with the active layer 126 can have a width that is approximately equal to or only slightly greater than the width of the fixed waveguide portion 108. Thus, the semiconductor material layer 128 can provide a substantially greater modal confinement of the optical signal OPT than the semiconductor material layer 78 in the tunable optical device 50 in the example of FIG. 2.

Figure 4:
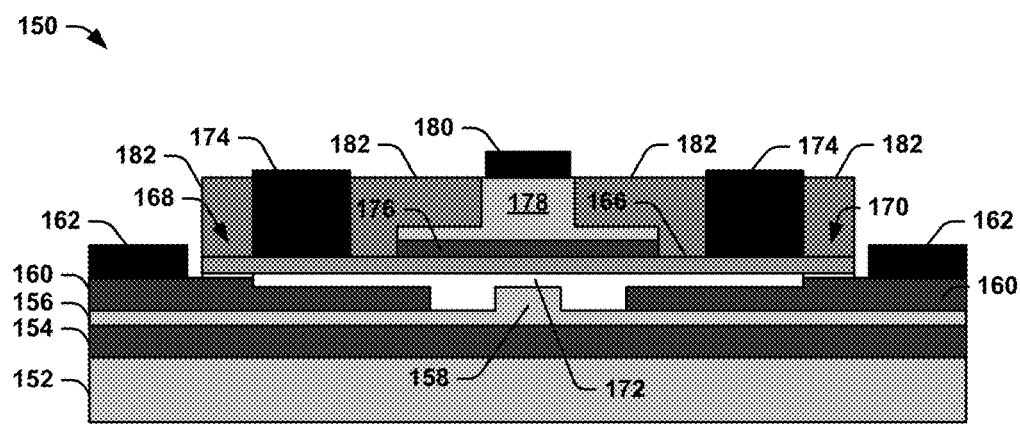
FIG. 4 illustrates yet another example of a tunable optical device.

FIG. 4 illustrates yet another example of a tunable optical device 150. The tunable optical device 150 can correspond to the optical device 12 in the example of FIG. 1. For example, the tunable optical device 50 can be configured as a laser (e.g., a hybrid laser), or as any of a variety of other types of optical devices, such as a photodetector, a hybrid amplifier, and/or a modulator. The tunable optical device 100 is demonstrated in the example of FIG. 4 in a cross-sectional view demonstrating the fabrication material layers.

The tunable optical device 150 is configured substantially similar to the tunable optical device 50 in the example of FIG. 2. In the example of FIG. 4, the tunable optical device 150 includes a substrate layer 152, an insulator (e.g., oxide) layer 154, and a semiconductor layer 156, such as can be fabricated from a silicon-on-insulator (SOI) structure, with the semiconductor layer 156 including an etched portion 158 corresponding to a fixed waveguide portion (hereinafter "fixed waveguide portion 158") configured to propagate the optical signal OPT. In addition, the tunable optical device 150 includes a control layer 160 (e.g., a P++ silicon layer) and a pair of electrodes 162 that overly the control layer 160 to form an optical tuning system (e.g., the optical tuning system 20). The tunable optical device 150 also includes a semiconductor membrane layer 166 coupled to the control layer 160 (e.g., via a dielectric insulator) at a first location 168 and at a second location 170 that are each separate from and spaced apart from the fixed waveguide portion 158 to form a tunable air gap 172, similar to as described previously.

The tunable optical device 150 also includes carrier-injection electrodes 174 that are arranged on top of the semiconductor membrane layer 166 and oppositely spaced apart with respect to the fixed waveguide portion 158. The tunable optical device 150 further includes an active layer 176, a semiconductor material layer 178 overlying the active layer 176, and a carrier-injection layer 180. As an example, the carrier-injection electrodes 174 can correspond to N-type carrier doped while the carrier-injection layer 180 can correspond to P-type carrier doped. The active layer 176 can thus correspond to an active region, such as to generate photons in the example of the tunable optical device 150 corresponding to a hybrid-laser. The semiconductor material layer 178 can correspond, for example, to a Group III-V layer (e.g., P—InP).

In the example of FIG. 4, the semiconductor material layer 178 is demonstrated as stepped, such that the portion of the semiconductor material layer 178 that is not in contact with the active layer 176 has a width that is substantially less than the width of the portion of the semiconductor material layer 178 that is in contact with the active layer 176. For example, the portion of the semiconductor material layer 178 that is not in contact with the active layer 176 can have a width that is approximately equal to or only slightly greater than the width of the fixed waveguide portion 158. Thus, the semiconductor material layer 178 can provide a substantially greater modal confinement of the optical signal OPT than the semiconductor material layer 78 in the tunable optical device 50 in the example of FIG. 2. In addition, the tunable optical device 150 further includes a regrown epitaxial layer 182 that substantially surrounds the carrier-injection electrodes 174, the active layer 176, and the semiconductor material layer 178 and which overlies the first location 168 and the second location 180 at which the semiconductor membrane layer 166 is coupled. As an example, the regrown epitaxial layer 182 can be provided for passivating the etch-exposed active and semiconductor material layers 176 and 178. For example, the regrown epitaxial layer 182 can have a doping that is opposite the doping of the semiconductor material layer 178, such that injected carriers can effectively be confined to flow toward an approximate center of the active layer 176.

Figure 5:
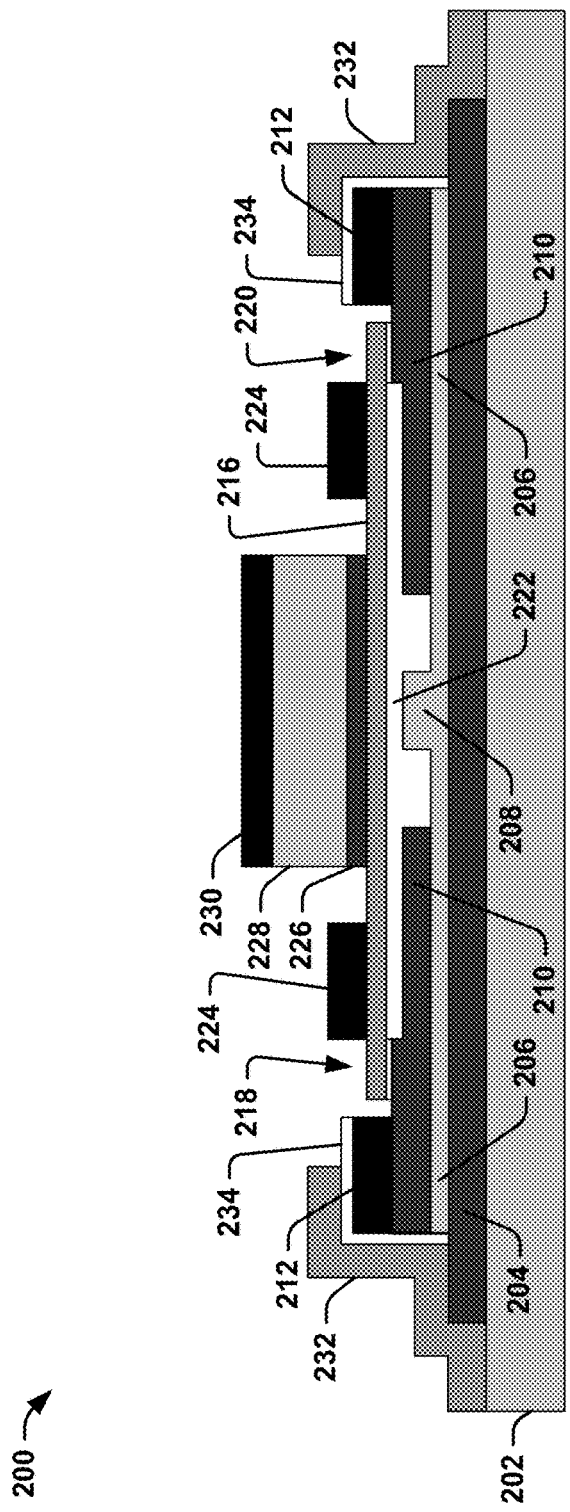
FIG. 5 illustrates yet a further example of a tunable optical device.

FIG. 5 illustrates yet another example of a tunable optical device 200. The tunable optical device 200 can correspond to the optical device 12 in the example of FIG. 1. For example, the tunable optical device 50 can be configured as a laser (e.g., a hybrid laser), or as any of a variety of other types of optical devices, such as a photodetector, a hybrid amplifier, and/or a modulator. The tunable optical device 100 is demonstrated in the example of FIG. 5 in a cross-sectional view demonstrating the fabrication material layers.

The tunable optical device 200 is configured substantially similar to the tunable optical device 50 in the example of FIG. 2. In the example of FIG. 5, the tunable optical device 200 includes a substrate layer 202, an insulator (e.g., oxide) layer 204, and a semiconductor layer 206, such as can be fabricated from a silicon-on-insulator (SOI) structure, with the semiconductor layer 206 including an etched portion 208 corresponding to a fixed waveguide portion (hereinafter "fixed waveguide portion 208") configured to propagate the optical signal OPT. In addition, the tunable optical device 200 includes a control layer 210 (e.g., a P++ silicon layer) and a pair of electrodes 212 that overly the control layer 210 to form an optical tuning system (e.g., the optical tuning system 20). The tunable optical device 200 also includes a semiconductor membrane layer 216 coupled to the control layer 210 (e.g., via a dielectric insulator) at a first location 218 and at a second location 220 that are each separate from and spaced apart from the fixed waveguide portion 208 to form a tunable air gap 222, similar to as described previously.

The tunable optical device 200 also includes carrier-injection electrodes 224 that are arranged on top of the semiconductor membrane layer 216 and oppositely spaced apart with respect to the fixed waveguide portion 208. The tunable optical device 200 further includes an active layer 226, a semiconductor material layer 228 overlying the active layer 226, and a carrier-injection layer 230. As an example, the carrier-injection electrodes 224 can correspond to N-type carrier doped while the carrier-injection layer 230 can correspond to P-type carrier doped. The active layer 226 can thus correspond to an active region, such as to generate photons in the example of the tunable optical device 200 corresponding to a hybrid-laser. The semiconductor material layer 228 can correspond, for example, to a Group III-V layer (e.g., P—InP).

In addition, the tunable optical device 200 includes thermal shunts 232. As an example, the thermal shunts 232 can be fabricated as a metallic material, such as gold, silver, copper, any of a variety of dielectric materials e.g., $Al_2O_3$), semiconductor materials (e.g., poly-Si), or a variety of other materials having a high thermal conductivity. The thermal shunt 232 is demonstrated as coupled to the substrate 202 and the insulator layer 204 in a step pattern, and is separated from the semiconductor layer 206, the control layer 210, and each of the electrodes 212 via an insulating barrier 234. Alternatively, the insulating barrier 234 could be omitted from the tunable optical device 200, such that the thermal shunts 232 could instead be coupled to the electrodes 212 or the electrodes 224 to provide thermal coupling to the substrate 202, so long as the electrodes 212 and 224 are electrically isolated with respect to each other. The thermal shunts 232 are fabricated in locations that are proximal to each of the respective first and second locations 218 and 220, and thus to the tunable air gap 222. As an example, the tunable air gap 222 can lead to a significant temperature increase in the active layer 226. Therefore, by providing the thermal shunt 232 proximal to the tunable air gap 222, deleterious effects resulting from undesired temperature increases in the active layer 226 can be substantially mitigated.

Figure 6:
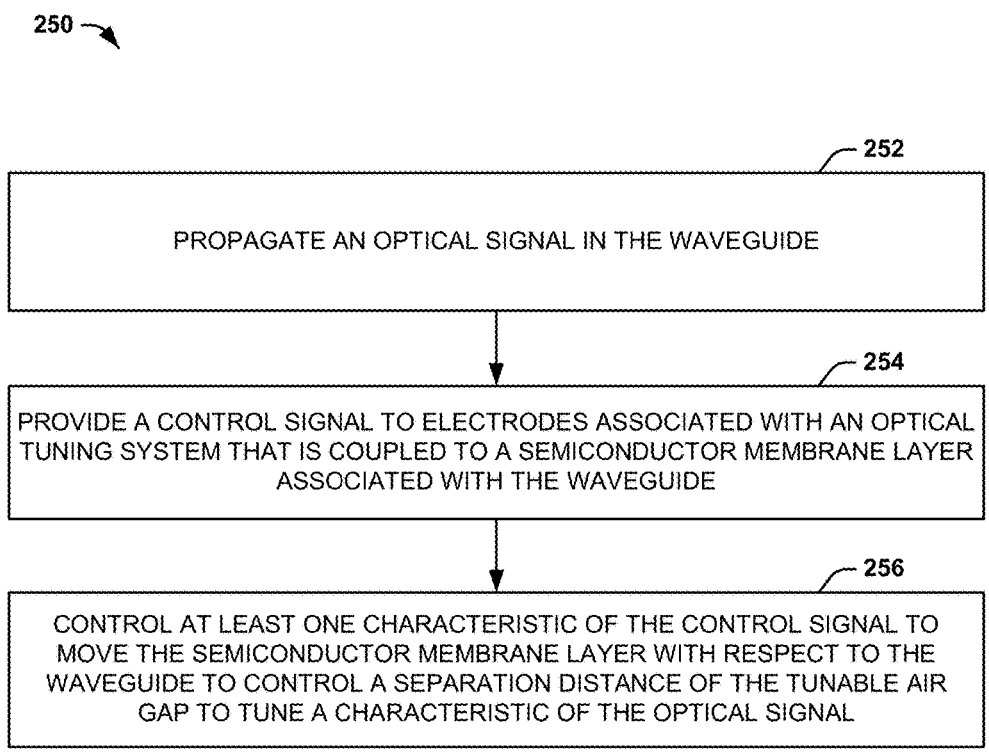
FIG. 6 illustrates an example of a method for tuning a characteristic of an optical device comprising a waveguide.

In view of the foregoing structural and functional features described above, an example method that can be implemented will be better appreciated with reference to FIG. 6. While, for purposes of simplicity of explanation, the methodology of FIG. 6 are shown and described as executing serially, it is to be understood and appreciated that the method is not limited by the illustrated order, as some aspects could, in other embodiments, occur in different orders and/or concurrently with other aspects from that shown and described herein. Moreover, not all illustrated features may be required to implement a method.

FIG. 6 illustrates a method 250 for tuning a characteristic of an optical device (e.g., the optical device 12) comprising a waveguide (e.g., the waveguide 14). At 252, an optical signal (e.g., the optical signal OPT) is propagated in the waveguide. At 254, a control signal (e.g., the control signal CTRL) is provided to electrodes (e.g., the electrodes 62) associated with an optical tuning system (e.g., the optical tuning system 20) that is coupled to a semiconductor membrane layer (e.g., the semiconductor membrane layer 16) associated with the waveguide. The semiconductor membrane layer can be separated from a fixed waveguide portion by a tunable air gap (e.g., the tunable air gap 18). At 256, at least one characteristic of the control signal is controlled to move the semiconductor membrane layer with respect to the waveguide to control a separation distance (e.g., the separation distance "G") of the tunable air gap to tune a characteristic of the optical signal.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An optical device system comprising:
   a waveguide comprising a fixed waveguide portion to propagate an optical signal, a semiconductor membrane layer, and a tunable air gap that separates the fixed waveguide portion and the semiconductor membrane layer; and
   an optical tuning system comprising a control layer offset from the semiconductor membrane layer to generate an electric field providing either an attractive force or a repulsive force to move the semiconductor membrane layer with respect to the fixed waveguide portion in response to a control signal to control a separation distance of the tunable air gap to tune a characteristic of the optical signal.

2. The system of claim 1, wherein the semiconductor membrane layer is coupled to the control layer of the optical tuning system at a first location and a second location that are each separate from and spaced apart from the fixed waveguide portion by a distance that is approximately equal with respect to each of the first and second locations.

3. The system of claim 1, further comprising a thermal shunt coupled to a portion of optical tuning system and arranged proximal to the tunable air gap to substantially mitigate deleterious temperature increase resulting from the tunable air gap.

4. The system of claim 1, wherein the control layer comprises a doped semiconductor layer or a metal or a conductive polymer that is coupled to the semiconductor membrane layer; and
   the optical tuning system further comprises an electrode coupled to the control layer to receive the control signal to move the semiconductor membrane layer with respect to the fixed waveguide portion.

5. The system of claim 1, wherein the fixed waveguide portion is fabricated from a first silicon layer associated with a silicon-on-insulator (SOI) structure, the system further comprising:
   a substrate formed from a second silicon layer associated with the SOI structure; and
   an oxide layer interconnecting the first and second silicon layers and being formed from an insulator layer associated with the SOI structure.

6. The system of claim 1, wherein further comprising:
   an active layer overlying the semiconductor membrane layer; and
   a semiconductor material layer overlying the active layer and having a width that is less than a width of the active layer to substantially further confine optical modes associated with the optical signal.

7. The system of claim 6, further comprising a regrown epitaxial layer that substantially surrounds the active region layer and the semiconductor layer and which overlies a first location and a second location at which the semiconductor membrane layer is coupled to the optical tuning system.

8. The system of claim 1, wherein the control layer generates the electric field providing either the attractive force or the repulsive force based on an amplitude and polarity of the control signal.

9. The system of claim 8, wherein a separation distance of the tunable air gap is decreased when the electrical field provides the attractive force and the separation distance is increased when the electrical field provides the repulsive force.

10. The system of claim 8, further comprising a carrier-injection electrode coupled to the semiconductor membrane layer having a polarity and wherein the electric field provides either the attractive force or the repulsive force based on the polarity of the control signal relative to the polarity of the semiconductor membrane layer.

* * * * *